United States Patent
Jung

(10) Patent No.: US 7,790,547 B2
(45) Date of Patent: Sep. 7, 2010

(54) NON-VOLATILE MEMORY DEVICE AND METHOD FOR FABRICATING THE SAME

(75) Inventor: Jin Hyo Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 767 days.

(21) Appl. No.: 11/645,497

(22) Filed: Dec. 27, 2006

(65) Prior Publication Data

US 2007/0148845 A1    Jun. 28, 2007

(30) Foreign Application Priority Data

Dec. 28, 2005   (KR) ...................... 10-2005-0131478

(51) Int. Cl.
*H01L 21/336* (2006.01)
(52) U.S. Cl. .................. 438/257; 438/261; 438/264; 438/593; 257/E21.422
(58) Field of Classification Search .................. 438/197, 438/257, 264, 261, 593; 245/E21.422
See application file for complete search history.

(56) References Cited

U.S. PATENT DOCUMENTS

| 5,930,629 | A * | 7/1999 | Fukumoto | 438/261 |
| 6,232,187 | B1 * | 5/2001 | Kuroi et al. | 438/287 |
| 6,835,987 | B2 * | 12/2004 | Yaegashi | 257/391 |

* cited by examiner

*Primary Examiner*—Michael Trinh
(74) *Attorney, Agent, or Firm*—Lowe Hauptman Ham & Berner LLP

(57) ABSTRACT

A method and non-volatile memory device are provided that are characterized by ion-implantation of impurities in the sidewalls of a first electrode. The inclusion of impurities in the sidewalls eliminates geometric abnormalities, referred to herein as a bird's beak, in the first electrode, which are caused by numerous oxidation processes being performed in the overall memory fabrication process. By eliminating these geometric abnormalities, thickening of the block oxide layer proximate the area of geometric abnormalities does not occurring, resulting in a memory device capable of efficiently programming and erasing data.

8 Claims, 5 Drawing Sheets

*(PRIOT ART)*

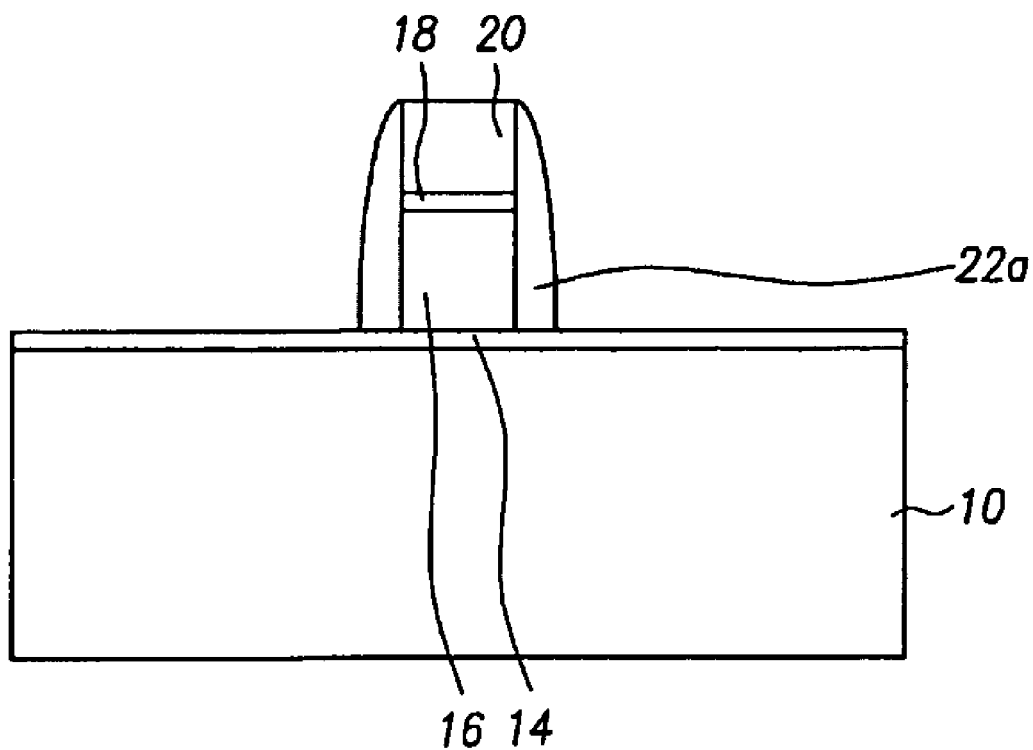

NON-VOLATILE MEMORY DEVICE AND METHOD FOR FABRICATING THE SAME

CLAIM OF PRIORITY UNDER 35 U.S.C. §119

The present application claims priority to Korean patent application No. KR 2005-0131478, filed in the Korean Patent Office on Dec. 28, 2005, the entire contents of which is hereby incorporated by reference herein.

FIELD OF THE INVENTION

The present invention relates to a semiconductor device; and, more particularly, to a non-volatile memory device and a fabricating method thereof.

BACKGROUND OF THE INVENTION

A non-volatile memory device is capable of electrically erasing and storing data and of retaining data without requiring a power supply. As such, non-volatile memory devices are widely used in a variety of fields. The non-volatile memory devices are typically classified into a NAND-type and a NOR-type. A NAND-type memory cell is normally used to store data; and a NOR-type memory cell is usually used for booting up a computing device (e.g., loading an operating system on a computing device).

A NOR-type non-volatile memory device structurally includes a plurality of memory cells each including a single transistor that is connected in parallel to one bit line. Additionally, only one memory cell transistor is connected between a drain connected by the bit line and a source connected by a common source line. The NOR-type non-volatile memory device has an advantage, in that, the current of the memory cell is high and it can be operated at high speed. However, it also has a disadvantage, in that, it is difficult to physically integrate within area confines due to the large area occupied by the contact of the bit line and by the source line.

Since a plurality of memory cells are connected in parallel to the bit line in the NOR-type non-volatile memory device, if a threshold voltage of the memory cell transistor becomes lower than a voltage (usually 0V) applied to a word line of the not-selected memory cells, a current flows between the source and the drain, regardless of the ON/OFF state of the selected memory cells. This results in an operational failure because all of the memory cells may be read during the ON state. In order to solve the aforementioned problem, a non-volatile semiconductor memory device having a structure generally called a split-gate type has been suggested.

Meanwhile, the non-volatile memory device can be classified into a flash memory device having a laminated gate structure of a FLOTOX structure, and a SONOS device where a multilayered gate insulating film is formed structurally similar to a MOS transistor. Since the gate insulating film of the SONOS device is a multilayered insulating layer for storing electric charges; and electric charges are stored in a deep level trap, the SONOS device compared to the flash memory device has excellent reliability and the writing or erasing operation can be carried out at a low voltage.

FIGS. 1A to 1C illustrate a method of fabricating a split-gate type non-volatile memory device with a conventional SONOS structure, in accordance with the prior art.

Referring FIG. 1A, after a device isolation film (not shown in FIG. 1A) is formed on a semiconductor substrate 10 to limit an active region 11, an electric charge storage layer 14, a first conductive film and a capping film 18, 20 are formed. A polysilicon layer is usually used as the first conductive film.

Further, the electric charge storage layer 14 is formed by interposing an insulating film having a high trap density between a tunnel insulating film and a blocking insulating film. The electric charge storage layer 14 generally has a multilayer structure including a silicon oxide film, a silicon nitride film and a silicon oxide film (e.g., tunnel oxide—nitride—block oxide film, hereinafter, referred to as 'ONO film'). In addition, the capping film has a structure in which a buffer layer, i.e., a silicon oxide film 18, and a hard mask layer, i.e., a silicon nitride film 20, are laminated.

A first electrode 16 having the capping film 18, 20 deposited thereon is formed on the active region 11 by sequentially patterning the capping film and the first conductive film. Thereafter, by oxidizing polysilicon at sidewalls of the first electrode 16, a sidewall insulating film 22 (sidewall oxide film) is formed. After removing the portion of the electric charge storage layer 14 formed on the active region where the first electrode 16 is not formed thereon and performing an oxidation process, a gate insulating film 24 is formed.

Next, as shown in FIG. 1B, a second conductive film 26 is conformally formed on the gate insulating film 24 (gate oxide film) and the proximate first electrodes 16. The second conductive film 26 is formed of polysilicon just like the first conductive film. Thereafter, a photoresist pattern 28 is formed on the second conductive film 26. The photoresist pattern 28 has an opening 27, which limits the active region between the proximate first electrodes 16.

Referring to FIG. 1C, the second conductive film 26 is patterned by using the photoresist pattern 28 as an etching mask to expose the active region 11 between the proximate first electrodes 16. As a result of this process, a second electrode 26a is formed that is extended to the substrate in parallel thereto from the upper part of the first electrode 16.

As known by those skilled in the art, numerous oxidation processes are required to fabricate a semiconductor device; and, especially in forming a memory transistor with a logic transistor, even more oxidation processes are required. Therefore, as the sidewall oxide film 22 formed at the sidewalls of the first electrode 16 goes through the subsequent oxidation processes, an area A appears to have a bird's beak shape as shown in FIG. 2. Further, through the subsequent oxidation processes, the bird's beak formed at the sidewall oxide film 22 makes the block oxide film formed under the first electrode 16 partially thick as shown in the area A.

In general, in the case of a SONOS device, programming/erasing operations are carried out while electrons are trapped at a deep energy level of a nitride film by hot electron injection in the vicinity of the lower corner of the first electrode and are flown out to the substrate by a Fowler-Nordheim tunneling. However, since the bird's beak formed at both sides of the first electrode makes the block oxide film of an area where the programming/erasing operations occur thick, there is a difficulty with performing programming/erasing operations.

SUMMARY OF THE INVENTION

It is, therefore, an object of the present invention to provide a non-volatile memory device and a related method of manufacturing such a device in which a bird's beak does not occur at a first electrode. By eliminating the bird's beak of the first electrode, the thick region of the block oxide layer is averted and programming/erasing of the device can occur without difficulty. In accordance with an embodiment of the present invention, there is provided a method of forming a non-volatile memory device. The method includes forming an electric charge storage layer on a semiconductor substrate and forming a first conductive film on the electric charge storage layer.

The method additionally includes forming a first electrode having one or more sidewalls by patterning the first conductive film and ion-implanting impurities into the sidewalls of the first electrode. The method also includes removing a part of the electric charge storage layer where the first electrode is not formed, forming a gate oxide film on an active region where the part of the electric charge storage layer is removed and (g) forming a second electrode on the first electrode.

Furthermore, a capping insulating film may be formed on the first conductive film and the capping insulating film and the first conductive film may be patterned simultaneously. The impurities may be implanted into front, rear, left and right sidewalls of the first electrode to prevent a bird's beak from being formed on the sidewalls of the first electrode. Preferably, the impurities implanted include nitrogen. A sidewall oxide film may also be formed at the sidewalls of the first electrode to cure damages caused by patterning the first conductive film. An insulating spacer may also be formed at the sidewalls of the first electrode prior to removing a part of the electric charge storage layer to enhance the insulating characteristics of the first and the second electrodes. Additionally, one end portion of the second electrode may cover the top of the first electrode, and the other end portion may be formed on the gate oxide film in parallel with the substrate.

In accordance with another embodiment of the present invention, there is provided a non-volatile memory device which includes an electric charge storage layer formed on a semiconductor substrate, a first electrode formed on the electric charge storage layer and having one or more sidewalls that are ion-implanted with impurities, a gate oxide film formed on the first electrode, and a second electrode formed on the gate oxide film. Additionally, the invention is embodied in a method for forming a non-volatile memory device. The method includes forming a first electrode having one or sidewalls on a substrate, ion-implanting impurities into the one or more sidewalls of the first electrode and forming a second electrode on the first electrode.

BRIEF DESCRIPTION OF THE DRAWINGS

The above and other objects and features of the present invention will become apparent from the following description of preferred embodiments given in conjunction with the accompanying drawings, in which:

FIG. 4 shows a cross sectional view of a split-gate type non-volatile memory device, in accordance with another embodiment of the present invention.

DETAILED DESCRIPTION OF THE PREFERRED EMBODIMENTS

Hereinafter, preferred embodiments of the present invention will be described in detail with reference to the accompanying drawings so that they can be readily implemented by those skilled in the art.

Figure 1A:
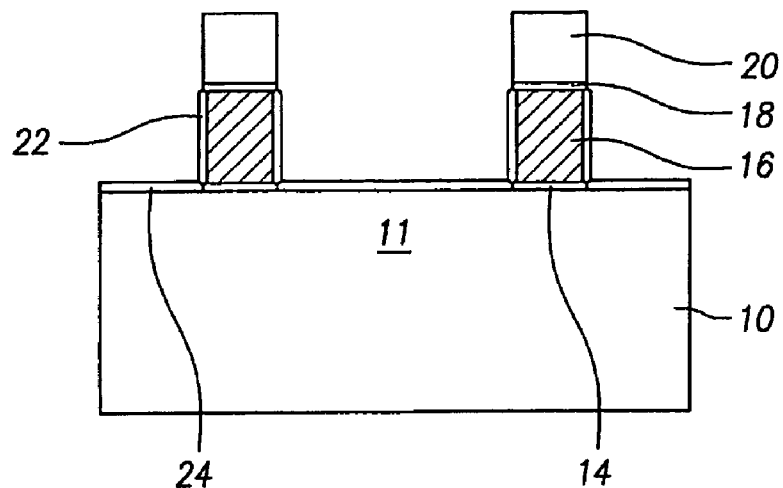
FIGS. 1A to 1C illustrate a method of fabricating a conventional split-gate type non-volatile memory device, in accordance with the prior art.
Figure 3A:
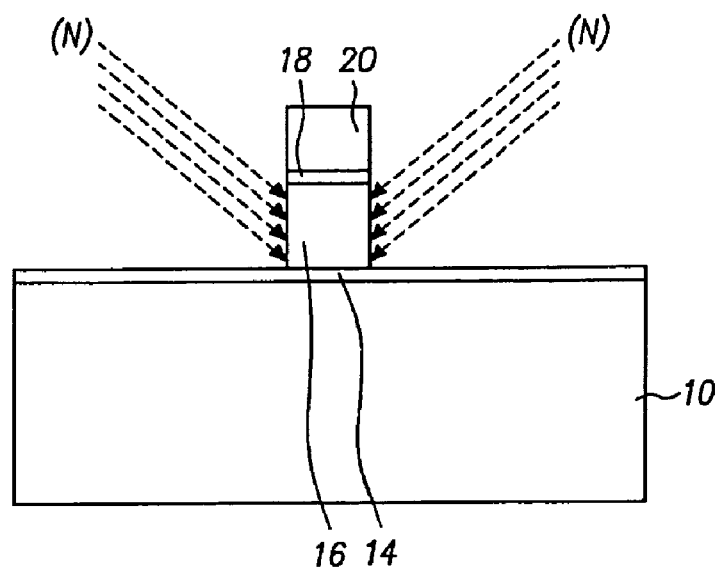
FIGS. 3A and 3B describe a method of fabricating a split-gate type non-volatile memory device, in accordance with an embodiment of the present invention.

Referring to FIG. 3A, depicted is a cross-sectional view of a construction of a split-gate type non-volatile memory device. A first electrode 16 with a capping film is formed on a substrate 10, the capping film being formed by laminating a buffer oxide film 18 and a hard mask nitride film 20. Since a method of forming the first electrode 16 is identical with the conventional method, the description thereof will be omitted. Further, FIG. 3A illustrates that, according to the present invention, the sidewall oxide film 22 shown in FIG. 1A is not formed at sidewalls of the first electrode 16 after the first electrode 16 is patterned. Meanwhile, an electric charge storage layer 14 is not removed from an active region of the substrate 10 where the first electrode 16 is not formed thereon.

In this manner, without removing/stripping the electric charge storage layer 14, nitrogen is ion-implanted as impurities into the sidewalls of the first electrode 16. Ion-implantation occurs at a predetermined implant angle that is sufficient to implant nitrogen into the vicinity of the lower corners of the first electrode. Furthermore, according to one embodiment, the nitrogen may be implanted sequentially into the four sidewalls, i.e., front, rear, left and right sidewalls, of the first electrode 16. For example, implantation may be performed by rotating the substrate 10 by 90 degrees and repeating it four times. After nitrogen is ion-implanted in the sidewalls, the implanted nitrogen is activated by a heat treatment.

As shown in FIG. 3A, after performing a nitrogen ion-implantation process, nitrogen is implanted only in the sidewalls of the first electrode 16 but is not implanted in the active region of the substrate. In other words, an ONO film which is the electric charge storage layer remaining on an active region where the first electrode 16 is not formed functions as a mask to keep nitrogen from being implanted in the substrate 10.

Figure 2:
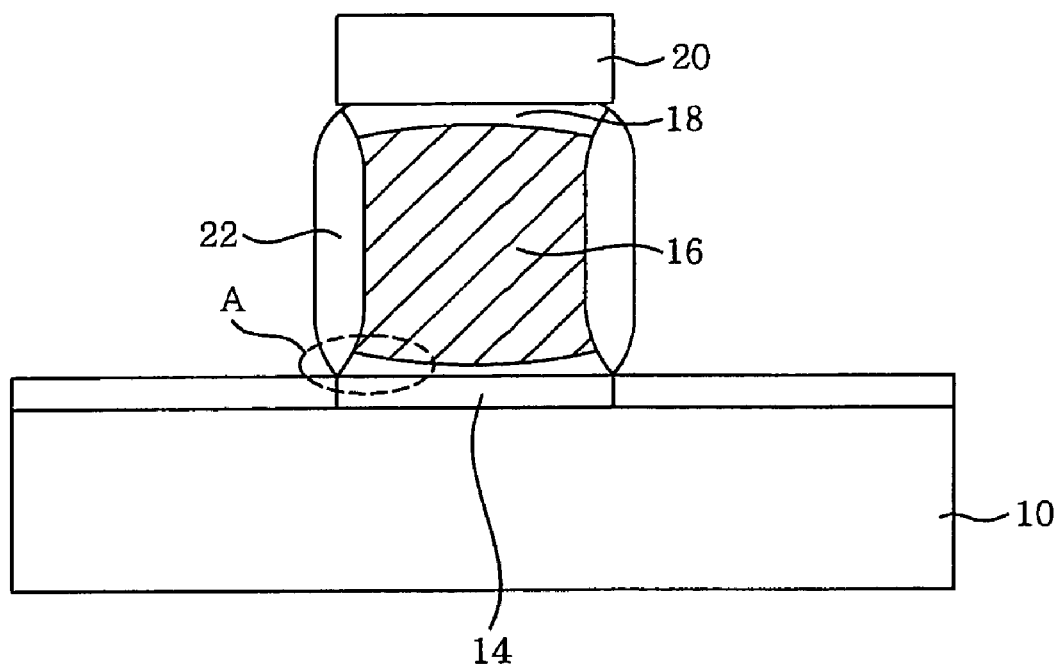
FIG. 2 shows an image of a cross section of a conventional split-gate photographed by a transmission electron microscope, in accordance with the prior art.

Further, the nitrogen implanted in the sidewalls of the first electrode 16 prevents the sidewalls of the first electrode 16 from being oxidized during the subsequent oxidation processes. Namely, in spite of another oxidation process, for example, a process forming the gate oxide film 24 shown in FIG. 1A, an oxide layer is not formed on surfaces of the sidewalls of the first electrode 16. Accordingly, the bird's beak, as shown in FIG. 2, is not generated, and therefore a thick portion of the block oxide layer of the ONO film 24 does not occur.

In another embodiment, prior to implanting nitrogen into the first electrode 16, a sidewall oxide film can be formed on the sidewalls of the first electrode 16. The sidewall oxide film is provided to cure damages caused by patterning the first electrode 16 and to insulate the first electrode from a second electrode formed through the subsequent processes. The aforementioned bird's beak is typically not generated as a result of the oxidation process that forms the sidewall oxide film. However, the subsequent oxidation processes may generate the bird's beak at the sidewall oxide film. Therefore, after forming the sidewall oxide film, nitrogen ion-implantation, as shown in FIG. 3A, is performed. As such, the nitrogen ion-implantation process prevents the sidewall oxide film from growing and forming the bird's beak.

Figure 3B:
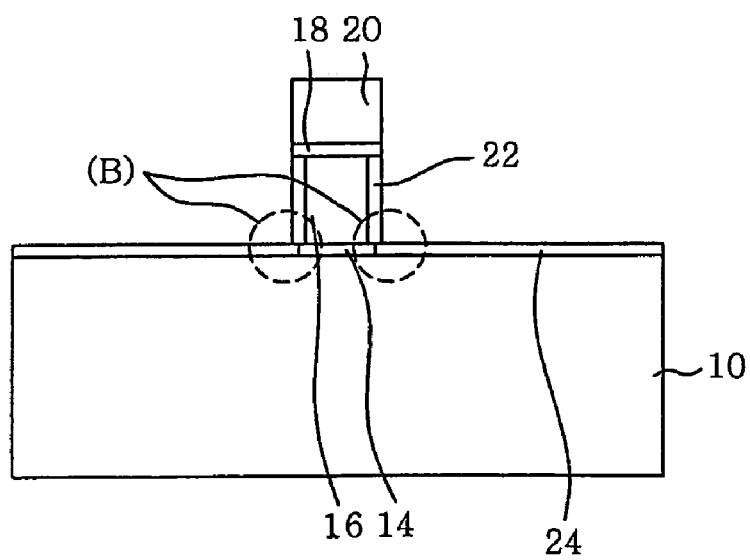

Next, referring to FIG. 3B, after forming a sidewall oxide film 22 and ion-implanting nitrogen thereto, the electric charge storage layer 14 remaining in an area where the first electrode 16 is not formed is stripped off. Thereafter, a gate oxide film 24 is formed on an active region of the substrate 10 where the electric charge storage layer is removed. Here, during the silicon oxidation process used to form the gate oxide film 24, the sidewall oxide film 22 formed on the first electrode 16 is not grown by implanted nitrogen, and in particular formation of the bird's beak is suppressed in an area B.

Figure 1B:
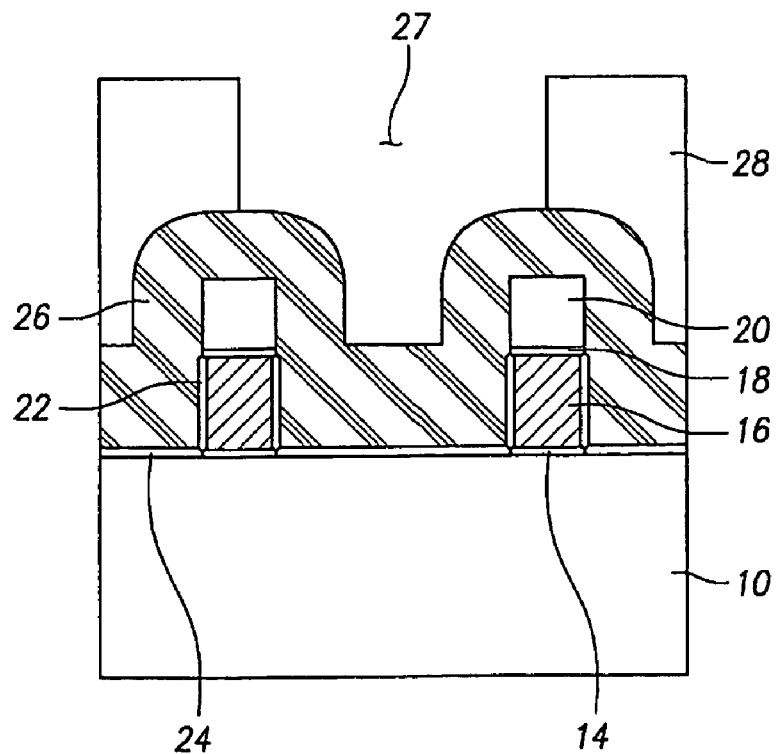
Figure 1C:
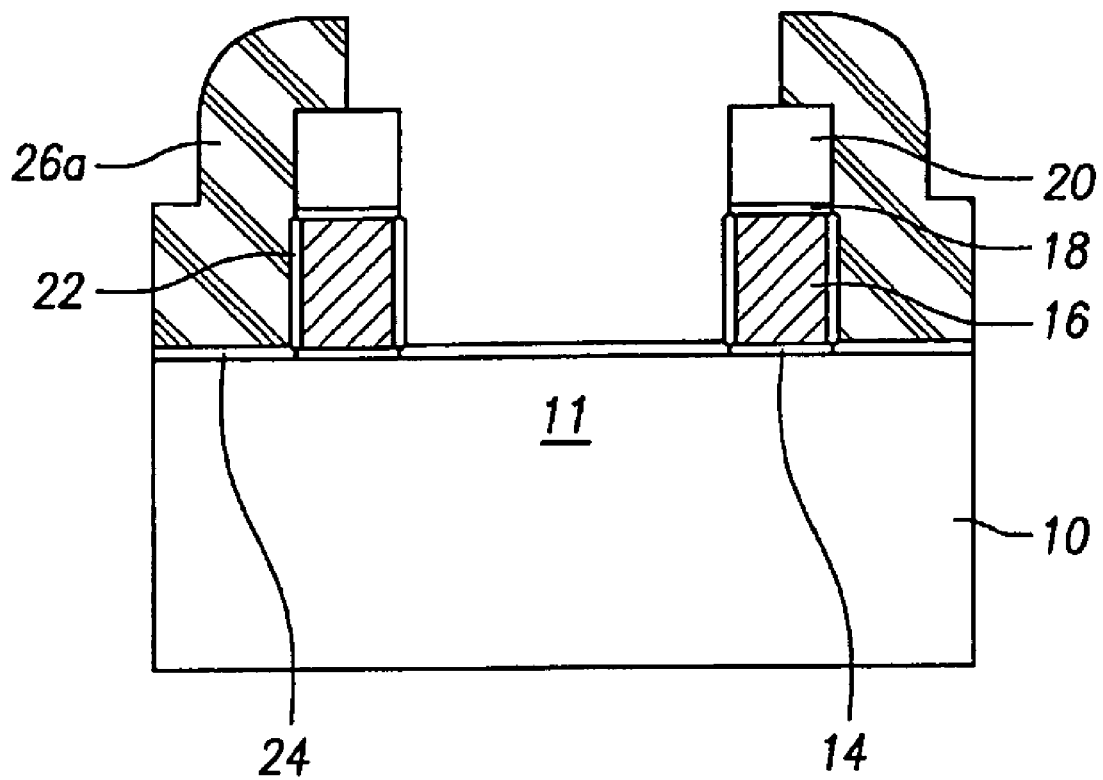

Subsequently, through processes as described in FIGS. 1B and 1C, a split-gate structure is finally completed.

Meanwhile, to improve insulation characteristics between the first electrode and the second electrode, an additional insulating film can be formed on the sidewalls of the first electrode. FIG. 4 shows an insulating film 22a formed of an oxide layer or a nitride layer, in accordance with an embodiment of the present invention. The insulating film 22a can be formed by depositing an oxide layer or a nitride layer on a front side of the substrate 10 and then performing an etch-back process. Through the etch-back process, the insulating film 22a deposited on the substrate 10 remains in a form of a spacer at both sides of the sidewalls of the first electrode 16.

The formation process of the insulating spacer 22a can be performed after the nitrogen implantation process of FIG. 3a, and otherwise it can be carried out after the nitrogen implantation process, which is performed after forming the sidewall oxide film 22 at the sidewalls of the first electrode 16.

In accordance with the present invention, by implanting nitrogen into the sidewalls of the first electrode which forms a control gate, it is possible to prevent oxidation of the sidewalls of the first electrode and prevent the oxide film which is already formed from growing and forming a bird's beak. By preventing formation of the bird's beak in the first electrode, the block oxide layer of the ONO film 24 remains consistent in thickness and does not exhibit a thick portion proximate the area where the bird's beak would be located. Accordingly, programming/erasing operations of a non-volatile memory device can be performed efficiently.

While the invention has been shown and described with respect to the preferred embodiments, it will be understood by those skilled in the art that various changes and modifications may be made without departing from the spirit and scope of the invention as defined in the following claims.

What is claimed is:

1. A method of forming a non-volatile memory device, comprising the steps of:
   forming an electric charge storage layer on a semiconductor substrate;
   forming a first conductive film on the electric charge storage layer;
   forming a first electrode having one or more sidewalls by patterning the first conductive film;
   ion-implanting impurities into the one or more sidewalls of the first electrode, wherein a part of the electric charge storage layer on which the first electrode is not formed functions as a mask to thereby prevent the impurities from being ion-implanted into the semiconductor substrate;
   removing the part of the electric charge storage layer where the first electrode is not formed;
   forming a gate oxide film on an active region where the part of the electric charge storage layer is removed; and
   forming a second electrode on the first electrode.

2. The method of claim 1, wherein the step of forming the first conductive film further comprises forming a capping insulating film on the first conductive film and wherein forming the first electrode further comprises patterning the first conductive film and the capping insulating film simultaneously.

3. The method of claim 1, wherein the step of ion-implanting impurities further comprises ion-implanting into a front sidewall, a rear sidewall, a left sidewall and a right sidewall of the first electrode.

4. The method of claim 1, wherein the step of ion-implanting impurities further comprises ion-implanting nitrogen impurities into the one or more sidewalls of the first electrode.

5. The method of claim 1, further comprising forming a sidewall oxide film at the one or more sidewalls of the first electrode prior to ion-implanting impurities.

6. The method of claim 1, further comprising forming an insulating spacer at the one or more sidewalls of the first electrode prior to removing a part of the electric charge storage layer.

7. The method of claim 1, wherein the step of forming a second electrode on the first electrode further comprises forming a second electrode having a first end portion that covers a top portion of the first electrode and a second end portion formed on the gate oxide film.

8. The method of claim 1, wherein the electric charge storage layer is formed of an ONO film.

* * * * *